United States Patent
Morizumi et al.

(10) Patent No.: US 9,685,759 B2
(45) Date of Patent: Jun. 20, 2017

(54) SEMICONDUCTOR LASER DEVICE

(71) Applicant: NICHIA CORPORATION, Anan-shi, Tokushima (JP)

(72) Inventors: Naoto Morizumi, Yoshinogawa (JP); Takashi Namie, Anan (JP); Takashi Nakagawa, Anan (JP); Daisuke Komoda, Anan (JP); Hiroaki Shozui, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/248,318

(22) Filed: Aug. 26, 2016

(65) Prior Publication Data

US 2017/0063032 A1    Mar. 2, 2017

(30) Foreign Application Priority Data

Aug. 28, 2015  (JP) .................. 2015-169117

(51) Int. Cl.
*H01S 5/02* (2006.01)
*H01S 5/022* (2006.01)
(Continued)

(52) U.S. Cl.
CPC .......... *H01S 5/02208* (2013.01); *H01S 5/005* (2013.01); *H01S 5/02212* (2013.01);
(Continued)

(58) Field of Classification Search
CPC ............. H01S 5/02208; H01S 5/02212; H01S 5/02272; H01S 5/02288; H01S 5/02296;
(Continued)

(56) References Cited

U.S. PATENT DOCUMENTS

2014/0153276 A1   6/2014  Nozaki
2015/0009703 A1   1/2015  Morizumi et al.
(Continued)

FOREIGN PATENT DOCUMENTS

JP   2008-147289 A    6/2008
JP   2008-305936 A   12/2008
(Continued)

OTHER PUBLICATIONS

Extended European Search Report of the corresponding European Patent Application No. 16186071.3, dated Feb. 9, 2017.

*Primary Examiner* — Armando Rodriguez
(74) *Attorney, Agent, or Firm* — Global IP Counselors, LLP

(57) ABSTRACT

A semiconductor laser device includes a base, a semiconductor laser element, a lid, a support member, a wavelength converting member, a holding member, and a buffer material. The lid has a recess formed in an upper portion of the lid, and a through-hole formed in the bottom of the recess. The support member is disposed in the recess and has a through-hole. A diameter of the through-hole of the support member is smaller than that of the through-hole of the lid. A coefficient of thermal expansion of the support member is different from that of the lid. The wavelength converting member is supported in the through-hole of the support member. The holding member is fixed to the lid and holds the support member. The buffer material is disposed in at least a part of a space between the lateral surfaces of the recess and the support member.

21 Claims, 4 Drawing Sheets

(51) Int. Cl.
*H01S 5/30* (2006.01)
*H01S 5/00* (2006.01)
*H01S 5/024* (2006.01)
*F21S 8/10* (2006.01)

(52) U.S. Cl.
CPC ...... *H01S 5/02272* (2013.01); *H01S 5/02288* (2013.01); *H01S 5/02296* (2013.01); *H01S 5/02469* (2013.01); *H01S 5/3013* (2013.01); *F21S 48/11* (2013.01)

(58) Field of Classification Search
CPC .... H01S 5/02469; H01S 5/005; H01S 5/3013; H01S 5/0092; F21S 48/11
See application file for complete search history.

(56) References Cited

U.S. PATENT DOCUMENTS

| | | |
|---|---|---|
| 2015/0085388 A1 | 3/2015 | Matsusue et al. |
| 2016/0186936 A1* | 6/2016 | Kiyota ................ H01S 5/02296 362/84 |

FOREIGN PATENT DOCUMENTS

| | | |
|---|---|---|
| JP | 2010-165834 A | 7/2010 |
| JP | 2010-199357 A | 9/2010 |
| JP | 2011-014587 A | 1/2011 |
| JP | 2014-110173 A | 6/2014 |
| JP | 2014-154723 A | 8/2014 |
| JP | 2014-160555 A | 9/2014 |
| JP | 2014-187224 A | 10/2014 |
| JP | 2015-065231 A | 4/2015 |

\* cited by examiner

SEMICONDUCTOR LASER DEVICE

CROSS-REFERENCE TO RELATED APPLICATIONS

This application claims priority to Japanese Patent Application No. 2015-169117 filed on Aug. 28, 2015. The entire disclosure of Japanese Patent Application No. 2015-169117 is hereby incorporated herein by reference.

BACKGROUND

1. Technical Field

The present disclosure relates to a semiconductor laser device.

2. Description of Related Art

A semiconductor laser device that combines a semiconductor laser element with a wavelength converting member, which is disposed above the semiconductor laser element, has been proposed in the past (for example, JP2008-147289A). With this device, the wavelength converting member is fixed in a state of being pressed against a package by a holding member so that the wavelength converting member will not fall out.

SUMMARY

With a conventional semiconductor laser device, however, there is a possibility that a support member may be shift due to a difference in coefficient of thermal expansion inherent to materials of components. The present invention is intended to reduce the position shift of the support member.

The semiconductor laser device according to one embodiment includes: a base; a semiconductor laser element provided above the base; a lid that is provided over the base, houses the semiconductor laser element, has a recess formed in an upper portion of the lid and having a lateral surface and a bottom, and has a through-hole formed in the bottom of the recess; a support member that is disposed in the recess, has a through-hole that is smaller in diameter than the through-hole of the lid and above the through-hole of the lid, has a coefficient of thermal expansion that is different from that of the lid, and has a lateral surface which is spaced from the lateral surface of the recess; a wavelength converting member that is supported in the through-hole of the support member; a holding member that is fixed to the lid and holds an upper surface of the support member, and a buffer material disposed in at least a part of a space between the lateral surface of the recess and the side surface of the support member.

With an embodiment of the present invention, there can be less position shift or misalignment of the support member, and light from the semiconductor laser element can be directed at the wavelength converting member more reliably.

DETAILED DESCRIPTION OF THE INVENTION

Figure 1A:
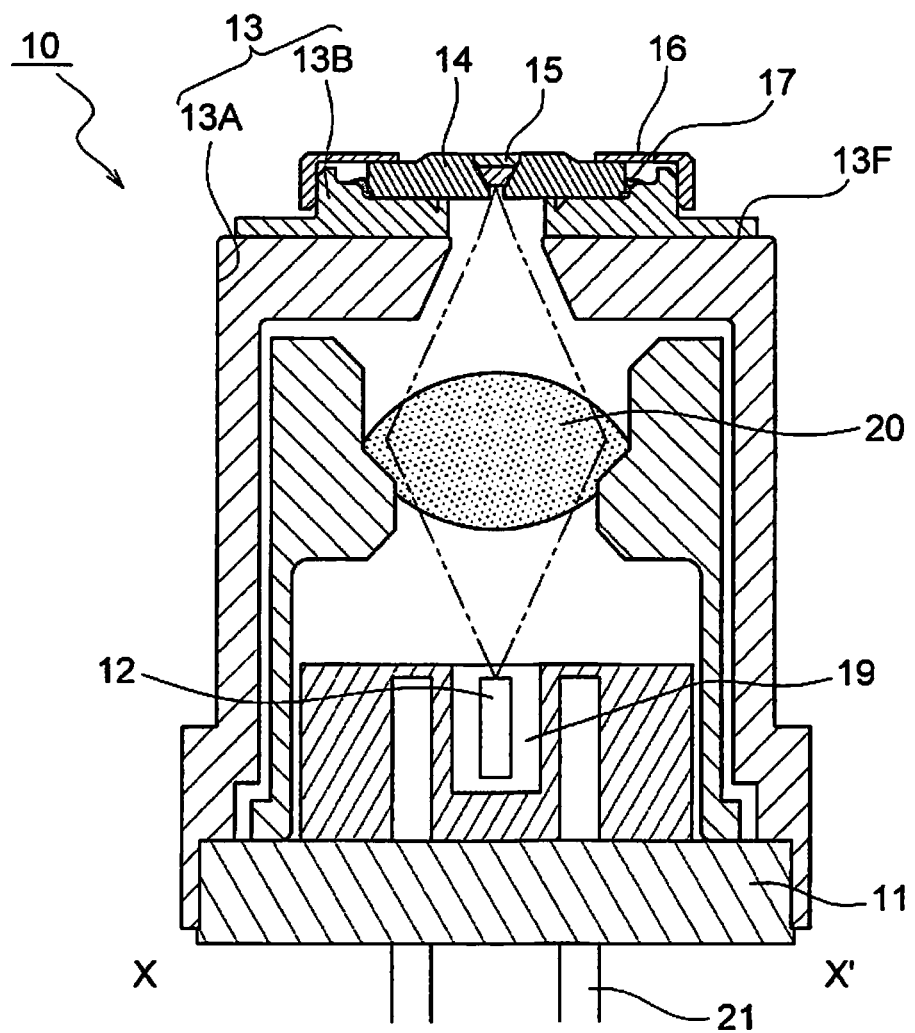
FIG. 1A is a schematic cross sectional view of an embodiment of the semiconductor laser device of the present invention (i.e., a cross section along the X-X' line in FIG. 1B)

Embodiments for implementing a semiconductor laser device of the present invention will be described below with reference to the accompanying drawings. In the following embodiment of the semiconductor laser device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

Embodiment 1

As shown in FIGS. 1A to 1D, the semiconductor laser device 10 in this embodiment has: a base 11; a semiconductor laser element 12 provided above the base 11; a lid 13 that is provided over the base 11, houses the semiconductor laser element 12, has a recess 13D formed in an upper portion of the lid 13 and having a lateral surface and a bottom, and has a through-hole 13C formed in the bottom of a recess 13D; a support member 14 that is disposed in the recess 13D, has a through-hole 14C that is smaller in diameter than the through-hole 13C of the lid 13 and above the through-hole 13C of the lid 13, has a coefficient of thermal expansion that is different from that of the lid 13, and has a lateral surface spaced from the lateral surface of the recess 13D; a wavelength converting member 15 that is supported in the through-hole 14C of the support member 14; a holding member 16 that is fixed to the lid 13 and holds an upper surface of the support member 14, and a buffer material 17 disposed on at least a part of a space between the lateral surface of the recess 13D and the lateral surface of the support member 14.

In recent years, various ways of dealing with heat dissipation have been adopted with semiconductor laser devices in order to realize high intensity of light emission. In particular, the wavelength converting member that generates heat resulting from directly radiated by laser light needs to be surrounded by a support member with good heat dissipation properties, thereby improving the heat dissipation. Here, the material of the support member that supports the wavelength converting member may be selected by taking into account light extraction in addition to heat dissipation from the wavelength converting member. In contrast, since there is no need to take light extraction into account, the lid to which the support member is fixed is sometimes formed from material different from that of the support member. In this case, a gap needs to be provided between the lateral surfaces of the recess and the lateral surfaces of the support member, taking into account the difference in coefficient of thermal expansion of the substances from which the lid and support member are made. This support member is fixed in the recess provided to the lid by a holding member during the manufacture of the semiconductor laser device, but the repeated expansion and contraction of the support member and the lid can sometimes cause position shift of the support member (i.e., shift in the left and right direction in FIG. 1A), according to the drive situation and so forth of the semiconductor laser device. Consequently, there is a possibility that light from the semiconductor laser element cannot be incident on the wavelength converting member.

In this embodiment, a buffer material is disposed on at least part of the space between the lateral surfaces of the support member and the lateral surfaces of the recess provided to the lid. This reduces position shift of the support member, so the light from the semiconductor laser element can be reliably directed at the wavelength converting member. Also, thermal expansion and contraction of the various members resulting from the drive of the semiconductor laser device, the usage environment, and so forth can be sufficiently moderated, and damage to the lid or support member can be reduced. In particular, higher output is needed in the recent use of semiconductor laser devices in automotive applications, and position shift of the support member can be less likely to occur even with respect to the heat generated at the wavelength converting member depending on drive situations.

Lid 13

As shown in FIG. 1A, the lid 13 is provided above the base 11 (discussed below) in the semiconductor laser device 10.

With a semiconductor laser element using a short-wavelength semiconductor material having a peak wavelength in a range of 320 to 530 nm, since both the energy and the optical density are high, organic matter tends to accumulate. Therefore, the semiconductor laser element is usually surrounded to enhance the airtightness and dustproofness within the laser device. In this embodiment, the lid 13 is composed of a first lid 13A that surrounds the semiconductor laser element 12, and a second lid 13B that is disposed on the first lid 13A, but the first lid 13A and the second lid 13B may alternatively be formed integrally. In this embodiment, as shown in FIG. 1A, the second lid 13B is fixed at a predetermined location of the first lid 13A, and the two are integrated. As in this embodiment, the structure that the second lid 13B is formed from a separate part and then integrated with the first lid 13A allows the lid 13 to be formed while positioning the focal point of the laser beam from the semiconductor laser element 12 with the through-hole 14C, so the laser beam can be reliably incident on the wavelength converting member 15.

As shown in FIG. 1A, the lid 13 has the through-hole 13C for passing through the light emitted from the semiconductor laser element 12. The through-hole 13C is located in the bottom of the recess 13D formed in the approximate center of the lid 13. In this embodiment, the recess 13D is provided to the second lid 13B.

The through-hole 13C is located in the approximate center of the recess 13D. The size of the through-hole 13C may be in a range of 0.2 mm to 3.5 mm, for example. The through-hole 13C may have a constant diameter in the thickness direction of the first lid, or it may have a shape that is tapered from bottom to top. In this embodiment, the shape is constricted from bottom to top. This ensures enough connection surface area between the lid 13 and the support member 14 without blocking off laser light, so heat generated at the wavelength converting member 15 can be more easily dissipated to the lid 13.

There are no particular restrictions on the material of the lid 13, but it is preferably composed of a metal. For example, it is preferable to use a material that can be fixed, and particularly welded, to the base 11 discussed below. For instance, it can include a metal selected from the group consisting of nickel, copper, cobalt, aluminum, and iron. A material whose main component is iron is particularly preferable, and one composed of stainless steel, KOVAR® (nickel-cobalt ferrous alloy), an Fe—Ni alloy, iron, or the like is better yet. The term "welding" as used herein means that the joined portions of two members are integrated continuously.

The first lid 13A may be formed from the same material as the second lid 13B, or may be formed from a different material. Preferably, the first lid 13A and the second lid 13B are formed from a material whose main component is iron. This allows the first lid 13A and the second lid 13B to be fixed securely.

Examples of the shape of the lid 13 include that of a bottomed cylinder (i.e., a circular cylinder, a polyhedral cylinder, etc.), a truncated cone (i.e., a truncated circular cone, a truncated pyramid, etc.), a dome, and modifications of these shapes. The lower surface 13E of the second lid 13B (see FIG. 1C) and the upper surface 13F of the first lid 13A (see FIG. 1A) are preferably flat surfaces so as to constitute a horizontal plane in the semiconductor laser device, and it is particularly favorable for them to be parallel to the base 11 (discussed below). This makes it easier to align the wavelength converting member 15 with the light from the semiconductor laser element 12.

The lateral surface of the recess 13D may be perpendicular to the bottom surface of the recess 13D, but is preferably sloped so as to spread out from bottom to top, and is even more preferably provided in a stepped shape so as to spread out from bottom to top. In this embodiment, the lateral surface of the recess 13D is provided in a stepped shape so as to spread out from bottom to top.

That is, the lateral surface of the recess 13D has an intermediate surface between the upper surface of the lid 13 (i.e., the upper surface of the second lid 13B in this embodiment) and the bottom surface of the recess, and the inside diameter below the intermediate surface is smaller than the inside diameter above the intermediate surface in the recess 13D. This stepped lateral surface helps to keep the buffer material from getting out of the recess 13D. The lateral surfaces constituting the stair-step (i.e., the lateral surface below the intermediate surface and the lateral surface above the intermediate surface) may be perpendicular to the bottom surface, or may be sloped so as to spread out from bottom to top. Also, the surface in between the side surfaces (i.e., the intermediate surface) constituting the stair-step can be a flat surface that is parallel to the bottom surface. The corners of the steppes may be chamfered, etc.

Taking into account the above-mentioned thermal expansion and contraction of the lid 13 and support member 14 caused by heat generated at the wavelength converting member 15, the lateral surface of the recess 13D is spaced from the lateral surface of the support member 14, with a gap present between the two. This gap D (see FIG. 1D) is preferably at least 10 μm and more preferably at least 15 μm. By existing the gap D, the lid 13 or support member 14 are less likely to be damaged even when expanded. The gap D is preferably no more than 200 µm and more preferably no more than 100 µm. This prevents the semiconductor laser device from being too large, which would happen if the recess 13D were larger than necessary. The gap D referred to here indicates the minimum distance between the lateral surface of the support member 14 and the lateral surface of the recess 13D.

In the case where there are two or more steps in the lateral surface of the recess 13D, the region surrounded by the step in which the support member 14 is housed may be the lowermost part (see FIG. 1C), or may be the middle part. In this embodiment, as shown in FIG. 1C, the support member 14 is disposed at the lowermost part, and the lower surface of the support member 14 is connected to the bottom surface of the recess 13D. This ensures enough contact surface area between the support member 14 and the lid 13, so heat can be more easily dissipated from the support member 14 to the lid 13.

Figure 1B:
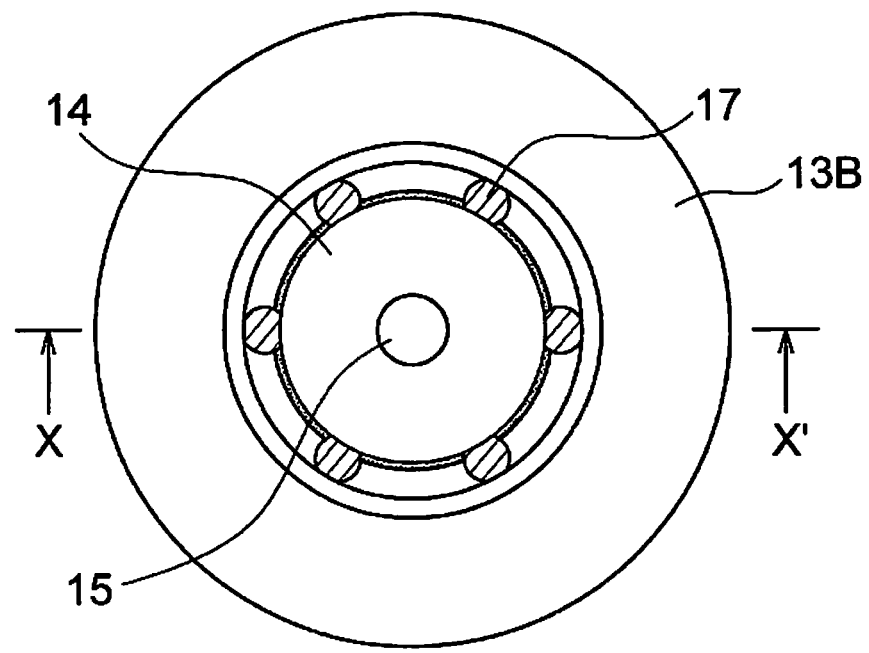
FIG. 1B is a plan view of the lid, support member, wavelength converting member, and buffer material in the semiconductor laser device in FIG. 1A.
Figure 1C:
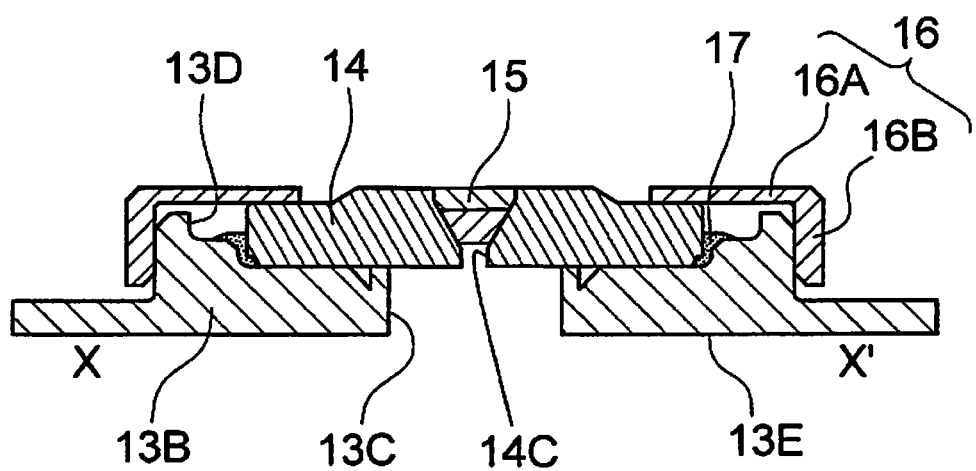
FIG. 1C is a schematic enlarged view of the lid, support member, wavelength converting member, holding member, and buffer material in the semiconductor laser device in FIG. 1A.
Figure 1D:
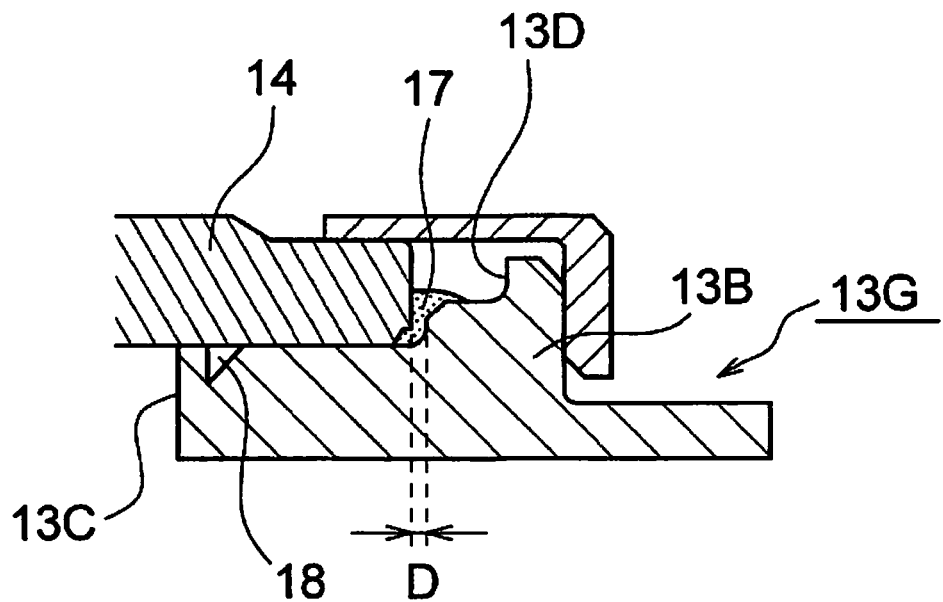
FIG. 1D is a further enlarged view of the lid, support member, holding member, and buffer material in FIG. 1C.

The bottom surface of the recess 13D may be substantially flat, but in this embodiment, as shown in FIG. 1D, a groove 18 is disposed in a portion near the through-hole 13C. This groove 18 prevents the buffer material 17 disposed between the support member 14 (discussed below) and the recess 13D from reaching the through-hole 13C. The groove 18 may be divided into a plurality of parts, in top view, or it may be formed continuously so as to surround the whole outer periphery of the through-hole 13C. In this embodiment, the groove 18 is formed continuously so as to surround the whole outer periphery of the through-hole 13C. This reliably prevents the buffer material 17 from reaching the through-hole 13C.

The second lid 13B preferably has a step 13G (see FIG. 1D) on its outer surface. The second lid 13B can be fixed to the first lid 13A by using this step 13G. In this embodiment, the second lid 13B is welded to the first lid 13A. The step 13G is preferably provided up to the area near the outer periphery of the first lid 13A. This ensures enough contact surface area between the first lid 13A and the second lid 13B, so heat generated at the wavelength converting member 15 can be dispersed more easily. Also, this makes it easier to weld the first lid 13A and the second lid 13B.

A lens 20 or other such member capable of converging laser light, for example, may be provided to the lid 13 between the semiconductor laser element 12 and the support member 14. This makes it easier for the light from the semiconductor laser element 12 to be incident on the through-hole 13C. In this embodiment, a third lid is formed on the inside of the first lid 13A, and the lens 20 is provided to the third lid. The area in which the semiconductor laser element 12 is provided (i.e., the interior of the third lid) is airtightly sealed by the third lid, the lens 20, and the base 11. The lens 20 may be provided to the first lid 13A, and the area in which the semiconductor laser element 12 is airtightly sealed by the first lid 13A, the lens 20, and the base 11.

Support Member 14

The support member 14 is a member used to hold the wavelength converting member 15. As shown in FIGS. 1A and 1C, the support member 14 is disposed in the recess 13D. The support member 14 has a through-hole 14C that is smaller in diameter than the through-hole 13C and that is located above the through-hole 13C.

The support member 14 is formed from a material having a coefficient of thermal expansion that is different from that of the lid 13, particularly the second lid 13B. Examples of the material of the support member 14 include ceramics, metals, and composites of ceramic and metal, and ceramics is preferably used. This is because ceramics generally have good thermal conductivity, and are less expanded and contracted by heat. Also, when the lid 13 is composed of a metal and the support member 14 is composed of a ceramic, it is more likely that the support member 14 is damaged by thermal expansion of the lid 13, and there is a greater need for a gap between the support member 14 and the lid 13, so the effect of reduction in position shift provided by this embodiment is more significant.

Examples of the ceramics include silicon carbide, aluminum oxide, silicon nitride, aluminum nitride, titanium oxide, tantalum oxide, zirconium oxide, diamond and a cermet. Examples of the metal include a refractory metal such as tungsten, tantalum, molybdenum and KOVAR®. Among them, the component is preferably formed from a material that includes aluminum oxide or aluminum nitride is preferably employed, as these have good thermal conductivity and high reflectivity.

The support member 14 is preferably composed of a reflective material that does not absorb much light, a material with good thermal conductivity, and/or a material with good heat resistance. Here, the reflective material means a material such that light emitted from the wavelength converting member 15 is preferably reflected at least 50%, more preferably at least 60%, and still more preferably at least 80%. Here, the thermal conductivity is preferably at least several W/m·k, more preferably at least s10 W/m·k, and still more preferably at least 25 W/m·k. The heat resistance here is preferably such that the melting point is at least a few hundred degrees centigrade, and more preferably at least 1000° C.

As long as it has the above-mentioned through-hole 14C, the shape of the support member 14 may be, for example, a flat board or a board having a convex component, a box, a lid, or any others.

The size and the thickness of the support member 14 can be suitably set according to the intended use, action, and effect. Taking into account maintaining the strength, the thickness is preferably about 0.20 mm or more, and taking into account downsizing of the semiconductor laser device, the thickness is preferably about 2 mm or less.

The through-hole 14C in top view may be circular, elliptical, triangular, quadrilateral, or some other such polyhedral shape, but circular or substantially circular is preferable to match the shape of the light from the light source. In this embodiment, the opening shape of the through-hole 14C is circular. The shape of the through-hole 14C in the support member 14 is preferably cylindrical, conical, or a shape that combines these.

There are no particular restrictions on the size of the through-hole 14C, as long as it is large enough for one or more beams of the light emitted from the semiconductor laser element 12 to pass through, for example. More specifically, the diameter or width is preferably in a range of 0.10 mm to 6.5 mm, although it depends on the type of semiconductor laser element 12.

The shape of the through-hole 14C may be the same in the thickness direction of the support member 14, or may spread out from bottom to top, or may be a shape that combines these. Preferably, the shape of the through-hole 14C spreads out from bottom to top. That is, the inner lateral surface of the support member 14 spreads out from bottom to top. This allows the light going from the wavelength converting member 15 toward the inner lateral surface of the support member 14 to be reflected upward and extracted. Thus, the light extraction efficiency can be improved. In the case where the through-hole 14C has a shape that spreads out from bottom to top, and the opening shape is circular, the diameter of the opening is preferably at least 0.1 mm and more preferably at least 0.15 mm, and preferably 1 mm or less and more preferably 0.7 mm or less. When the diameter is at least 0.1 mm, light from the semiconductor laser element 12 can be reliably incident in the through-hole 14C. When the diameter is less than 1 mm, the size of the opening above the through-hole 14C (on the light emission side) can be larger, and this helps avoid a decrease in the luminance of the semiconductor laser device. The spreading of the through-hole 14C may be as a slope or in steps. The "size of the through-hole 14C" refers to the size defined by the inner lateral surface of the support member 14.

In this embodiment, as shown in FIG. 1A, the through-hole 14C has a shape that spreads out in the thickness direction of the support member 14, that is, spreads out upward. Here, the lower opening shape in the through-hole 14C is circular, and the diameter is 0.20 mm. The upper opening shape in the through-hole 14C is also circular, and the diameter is 0.65 mm. The length of the through-hole 14C is equal to the thickness of the support member 14. This shape allows the return light of the light incident on the wavelength converting member 15 to be reflected by the inner lateral surface of the support member 14 and efficiently extracted on the light emission side.

A reflective film may be formed inside the through-hole 14C of the support member 14. As this reflective film, it is preferable to provide the inner lateral surface of the support member 14 with a metal film or a wavelength-selective film that reflects light whose wavelength has been converted. This allows light traveling to the inside surface of the support member 14 to be reflected and extracted.

Holding Member 16

The holding member 16 is a member used to holding the upper surface of the support member 14, and is fixed to the lid 13. In this embodiment, as shown in FIG. 1C, the holding member 16 has a part 16B that is fixed in contact with the outer lateral surface of the lid 13, and a part 16A that extends from the outside surface of the lid 13 to the upper surface of the support member 14 and holds the upper surface around the outside of the support member 14. The fixed part 16B is cylindrical, and surrounds the outer lateral surface of the lid 13. The upper part holding member 16A may be in the shape of a hook that extends from the fixed part 16B to multiple locations on the upper surface of the support member 14, but is preferably in the shape of a cylinder that holds the entire upper surface around the outside of the support member 14. This allows the support member to be stably fixed.

The length of the upper part holding member 16A holding the upper surface from the outer edge of the support member 14 may be less than the length from the outer edge to the through-hole 14C of the support member 14, and an example is in a range of about ⅕ to about 1/40 the overall width or length of the support member 14. Setting a distance at least the above range makes it easier for the support member 14 to be pressed by the holding member 16. Also, setting a distance no more than the above range realizes the shortened distance from the fixed part 16B to the part 16A holding the upper surface, so it is less likely that the holding member 16 can be pushed up by the support member 14.

The holding member 16 can be formed from the same materials listed above for the lid 13, for example, and is preferably formed from a material whose main component is iron. This allows welding to be applied for fixing the lid 13 and the holding member 16, and facilitates securely fixing of the lid 13 and the holding member 16.

The holding member 16 can be fixed to the lid 13 by welding or soldering. In this embodiment, the holding member 16 and the lid 13 are welded. Welding allows the joined portions of the two members to be integrated continuously, so they are securely fixed. It is also possible to fix the support member 14 to the lid 13 by using an adhesive, but in this case, the support member 14 sometimes separates from the lid 13 due to expansion and contraction of these two components caused by heat.

By using the holding member 16, the support member 14 cannot come off from the lid 13 as long as the holding member 16 does not come off from the lid 13.

Buffer Material 17

The buffer material 17 is disposed in at least part of the area between the lateral surface of the recess 13D of the lid 13 and the lateral surface of the support member 14. That is, the buffer material 17 is disposed so as to fill in at least part of the area between the lateral surface of the recess 13D and the lateral surface of the support member 14 as a top view. The buffer material 17 functions to reduce position shift of the support member 14 caused by repeated expansion and contraction of the lid 13 and the support member 14.

The buffer material 17 is preferably composed of a material having a Young's modulus smaller than a Young's modulus of the lid 13 and support member 14. That is, the buffer material 17 is preferably composed of a material that is softer than the lid 13 and support member 14. An example is a material with a Young's modulus of 150 GPa or less. Consequently, even though the lid 13 and the support member 14 repeatedly expand and contract, since the buffer material 17 deforms position shift of the support member 14 can be reduced as well as the buffer material 17 itself is less likely to be damaged.

For the buffer material 17, resins, eutectic solders, and the like can be used. Preferably, the buffer material is composed of a resin. As a resin, for example, silicone based resin or epoxy based resin can be used, and a silicone resin is preferably used.

In this embodiment, in view of welding to the base 11, a lid 13 composed of metal is used, and in view of heat dissipation from the wavelength converting member 15, a support member 14 composed of ceramic is used, and a buffer material 17 composed of a silicone resin is used. When the lid 13 is composed of a metal and the support member 14 is composed of ceramics, because there is a large difference in the coefficient of thermal expansion between the two components, there is much position shift of the support member 14. In this embodiment, however, a silicone resin, which has a small Young's modulus and is easily available, is employed as the buffer material 17, resulting in the reduction in the shift of the support member 14.

Figure 2:
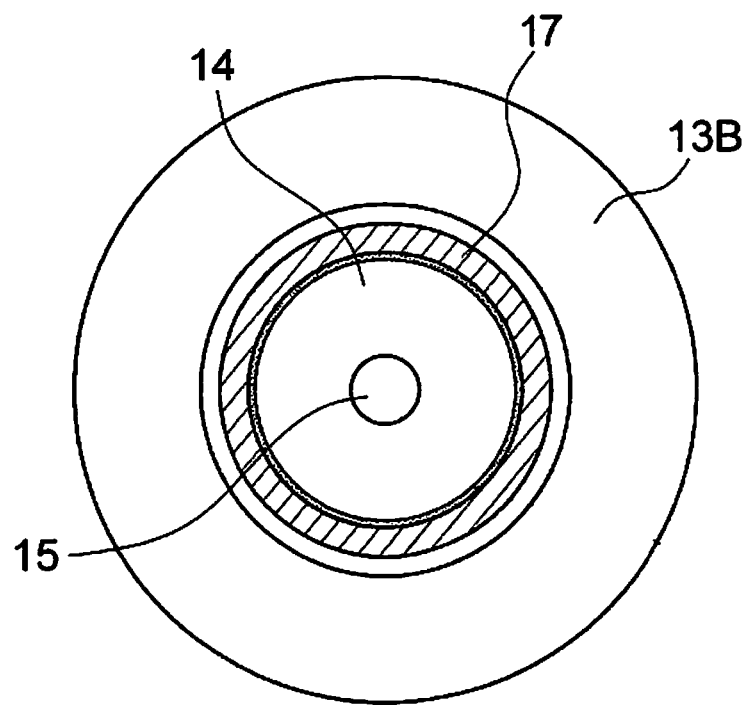
FIG. 2 is a plan view exemplary showing the layout of the buffer material.

The buffer material 17 may be disposed in the entire gap between the lateral surface of the recess 13D and the lateral surface of the support member 14, that is, all the way around the recess 13D (see FIG. 2), as a top view, but is preferably disposed at a plurality of locations as shown in FIG. 1B. Providing it at a plurality of locations makes less likely that the buffer material 17 enters the through-hole 13C. Also, it is easier to check whether there is no gap between the support member 14 and the bottom surface of the recess 13D. In the case where there is a gap between the support member 14 and the bottom surface of the recess 13D, it leads to reduction in the connection surface area between the support member 14 and the bottom surface of the recess 13D, so heat dissipation performance deteriorates. Therefore, it is preferable to confirm that the support member 14 and the recess 13D are properly connected. Confirmation of this connection can be performed by sucking air from below the support member 14, and determining that the components are connected once air cannot be vacuum up or detected. However, in the case where the buffer material 17 is disposed all the way around the support member 14, the flow of air is blocked by the buffer material 17, and as a result air cannot be detected, and even if there is a gap between the support member 14 and the bottom surface of the recess 13D, it may be determined that they are connected.

In contrast, in the case where the buffer materials 17 are disposed at a plurality of locations, the flow of air is not blocked by the buffer material 17, so it can be reliably determined whether the support member 14 is connected to the bottom surface of the recess 13D.

The buffer materials 17 are preferably provided at three or more locations, and are provided at six locations in this embodiment. The buffer materials 17 here are preferably disposed so that the adjacent buffer materials 17 are located at substantially equal intervals. This makes it easy to prevent position deviation of the wavelength converting member 15 due to shift of the support member 14.

Also, the buffer material 17 may be disposed over the entire region in height direction of the gap between the lateral surface of the recess 13D and the lateral surface of the support member 14, or may be disposed on only a part of the region in the height direction. It is particularly preferable for it to be disposed in the lower part.

The buffer material 17 may be disposed between the bottom surface of the recess 13D and the lower surface of the support member 14, as long as it is disposed in the gap between the lateral surface of the recess 13D and the lateral surface of the support member 14. With this arrangement, combined with the pressure exerted by the holding member 16, allows thermal expansion and contraction by the various members to be absorbed by the buffer material 17.

With this embodiment, the buffer material 17 is disposed between the lid 13 and the support member 14, and the upper surface of the support member 14 is securely held by the holding member 16. Consequently, even when the device is subjected to the load of a thermal cycle due to drive of the semiconductor laser device, the usage environment, or the like, and when the lid 13, the support member 14, etc., are formed from different materials, lateral position shift due to the different coefficients of thermal expansion inherent in the substances can be reduced by the buffer material 17. Furthermore, vertical shift can be reduced by the holding member 16.

Wavelength Converting Member 15

The wavelength converting member 15 is disposed in the through-hole 14C of the support member 14. The wavelength converting member 15 may be formed by dispersing a phosphor in a light-transmissive base member. It may also be formed by sintering a phosphor. When a phosphor is sintered, the phosphor may solely be sintered, or a mixture of a phosphor and a sintering aid may be sintered. The light-transmissive base member and the sintering aid are preferably inorganic materials. Examples of the light-transmissive base member include borosilicate glass, soda lime glass, soda glass and lead glass in consideration of heat dissipation, light resistance and heat resistance. Examples of the sintering aid includes aluminum oxide, silicon oxide and titanium oxide.

The phosphor, which absorbs the laser light from the semiconductor laser element 12 and converts the wavelength of the light to a different wavelength, is selected. As the phosphor, one known in the art can be used in consideration of the wavelength of light emitted from the light source, the color of light to be obtained, or the like. Examples of the phosphor include yttrium-aluminum-garnet (YAG)-based phosphors activated by cerium, lutetium-aluminum-garnet (LAG)-based phosphors activated by cerium, nitrogen-containing calcium aluminosilicate ($CaO—Al_2O_3—SiO_2$)-based phosphors activated by at least one of europium or chromium, silicate (($Sr, Ba)_2SiO_4$)-based phosphors activated by europium, α-sialon phosphors, β-sialon phosphors, KSF-based phosphors ($K_2SiF_6$:Mn), among them a phosphor having good heat resistance is preferred.

The thickness of the wavelength converting member 15 is preferably in a range of about 0.01 mm to about 1 mm, and more preferably in a range of about 0.05 mm to about 0.5 mm. The wavelength converting member 15 may be a single-layer structure, or may be a multilayer structure that includes materials of the same or different composition. In this embodiment, in order to obtain a semiconductor laser device that emits white light, a blue light emitting semiconductor laser element is used as the semiconductor laser element 12, and a stack of glass that contains a red light emitting phosphor disposed on a sinter of aluminum oxide and YAG activated with cerium is used as the wavelength converting member 15. This allows white light with excellent color rendering to be obtained. The upper surface of the wavelength converting member 15 is preferably substantially flush with the upper surface of the support member 14. This means that light does not spread out to the lateral direction from the wavelength converting member 15, so a semiconductor laser device with high luminance can be obtained.

A light-transmissive member may be disposed on the at least one of the upper surface or the lower surface of the wavelength converting member 15 in the through-hole of the support member 14. For example, a ceramic containing silicon oxide or aluminum oxide can be used for the light-transmissive member. Thus disposing a light-transmissive member in contact with the at least one of the upper surface or the lower surface of the wavelength converting member 15 improves the heat dissipation of the wavelength converting member 15.

Base 11

The base 11 is used to fix the semiconductor laser element 12 in the proper location. The base 11 can be made of a material containing AlN, SiC, $Al_2O_3$, or another such insulating member and/or a metal, but at least the portion touching the lid 13 is preferably made of a metal. This allows the base 11 and the lid 13 to be fixed by welding, so the base 11 and the lid 13 can be securely fixed. The base 11 can be made of the similar material as the lid 13.

The shape and size of the base 11 can be suitably adjusted according to the shape, size, and so forth needed for the semiconductor laser device. Examples of planar shapes are circular, elliptical, rectangular and other such polyhedral shapes, and shapes that are close to these. For instance, the base 11 has a shape in flat board, and in circular as a top view with a diameter of in a range of about 3 mm to 11 mm, or in the form having recesses or protrusions, or combination of recesses and protrusions on the upper surface of the base 11. The thickness is preferably in a range of about 0.5 mm to about 5 mm.

Leads 21 for connecting to an external power supply is usually provided to the base 11.

Semiconductor Laser Element 12

The semiconductor laser element 12 oscillates laser light, and has an active layer between an n-type semiconductor layer and a p-type semiconductor layer. The semiconductor laser element 12, for example, having an emission peak wavelength in a range of 300 nm to 500 nm, preferably 400 nm to 470 nm, and more preferably 420 nm to 470 nm can be used. For a semiconductor laser element that emits blue light, it is preferably formed by a Group III-V semiconductor (i.e., nitride semiconductor).

The semiconductor laser element 12 can be fixed to the base 11 via a sub-mount 19. For the sub-mount 19, a material with high thermal conductivity is preferably used. This makes it easier for heat to be dissipated from the semiconductor laser element 12. The sub-mount 19 can be formed by aluminum nitride, silicon carbide, silicon, or the like. In this embodiment, aluminum nitride is used for the sub-mount 19.

Embodiment 2

Figure 3A:
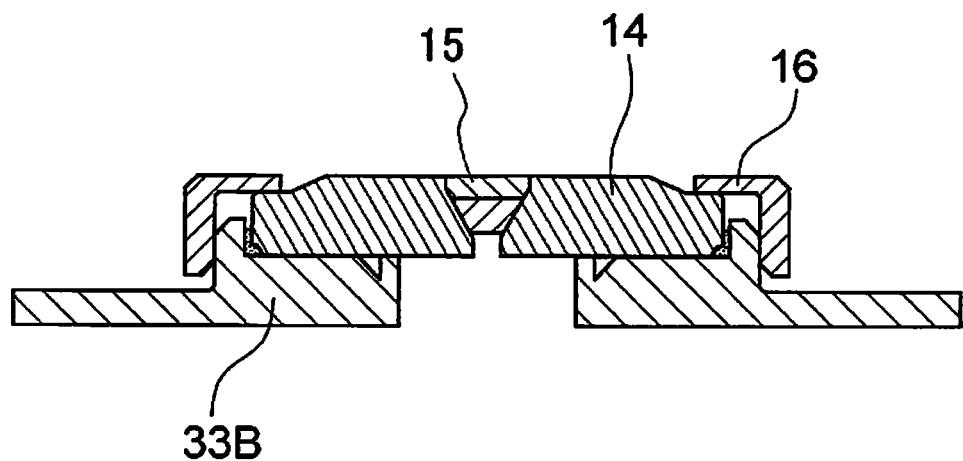
FIG. 3A is a schematic enlarged view of the lid, support member, wavelength converting member, holding member, and buffer material in the semiconductor laser device in FIG. 1A.
Figure 3B:
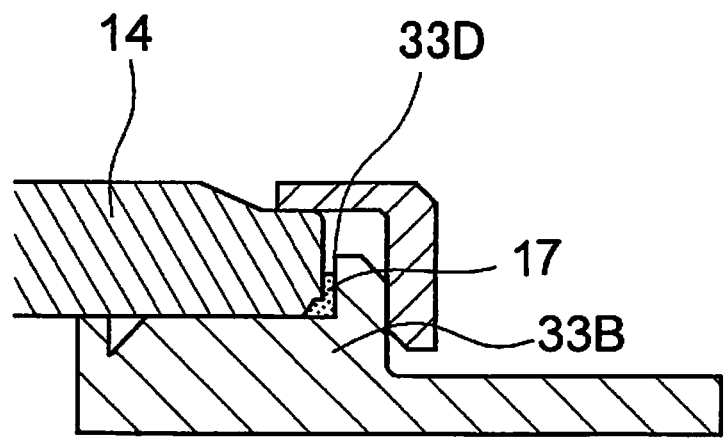
FIG. 3B is another enlarged view of the lid, support member, holding member, and buffer material in FIG. 3A.

As shown in FIGS. 3A and 3B, in this embodiment, the configuration is substantially the same as that of the semiconductor laser device in Embodiment 1, except that the lateral surface of a recess 33D of a second lid 33B is not stepped.

Again in this embodiment, position shift of the support member 14 in the lateral direction and the like can be prevented.

The semiconductor laser device in the embodiments of the present invention can be used for in- or on-vehicle applications such as a headlight, a light source of backlight; a variety of lighting; a variety of display devices such as display, billboard, or destination screen; or a variety of light sources for various kinds of a projector.

What is claimed is:

1. A semiconductor laser device comprising:
a base;
a semiconductor laser element provided above the base;
a lid provided over the base and housing the semiconductor laser element, the lid having a recess formed in an upper portion of the lid with the recess being defined by a lateral surface and a bottom, and the lid having a through-hole formed in the bottom of the recess;
a support member disposed in the recess and having a through-hole disposed above the through-hole of the lid, a diameter of the through-hole of the support member being smaller than a diameter of the through-hole of the lid, the support member having a coefficient of thermal expansion that is different from a coefficient of thermal expansion of the lid, and the support member having a lateral surface spaced apart from the lateral surface of the recess;
a wavelength converting member supported in the through-hole of the support member;
a holding member fixed to the lid and holding an upper surface of the support member; and
a buffer material disposed in at least a part of a space between the lateral surface of the recess and the lateral surface of the support member.

2. The semiconductor laser device according to claim 1, wherein
the buffer material is composed of a material having a Young's modulus smaller than a Young's modulus of the lid and a Young's modulus of the support member.

3. The semiconductor laser device according to claim 1, wherein
the buffer material is composed of a resin or an eutectic solder.

4. The semiconductor laser device according to claim 1, wherein
an opening of the through-hole of the support member is in a circular shape in plan view and has the diameter in a range of 0.1 mm to 1 mm on a lower side.

5. The semiconductor laser device according to claim 1, wherein
the through-hole of the support member has a cross-sectional shape that spreads out from bottom to top.

6. The semiconductor laser device according to claim 1, wherein
the support member is composed of a ceramic.

7. The semiconductor laser device according to claim 6, wherein
the support member is composed of aluminum oxide or aluminum nitride.

8. The semiconductor laser device according to claim 6, wherein
the lid is composed of a metal.

9. The semiconductor laser device according to claim 8, wherein
the lid is composed of a material containing iron as main component.

10. The semiconductor laser device according to claim 1, wherein
in plan view, the buffer material is disposed at a plurality of locations that are spaced apart from each other along a periphery of the support member.

11. The semiconductor laser device according to claim 1, wherein
the lateral surface of the recess has a stepped cross-sectional shape so as to spread out from bottom to top.

12. The semiconductor laser device according to claim 1, wherein
the holding member is welded to the lid.

13. The semiconductor laser device according to claim 1, wherein
the lid has a first lid surrounding the semiconductor laser element, and a second lid disposed on the first lid and having the recess.

14. The semiconductor laser device according to claim 8, wherein
the buffer material is composed of a resin.

15. The semiconductor laser device according to claim 1, wherein
a distance between the lateral surface of the recess and the lateral surface of the support member is in a range of 10 µm to 200 µm.

16. The semiconductor laser device according to claim 14, wherein
a distance between the lateral surface of the recess and the lateral surface of the support member is in a range of 10 µm to 200 µm.

17. The semiconductor laser device according to claim 1, further comprising
a lens provided in the lid between the semiconductor laser element and the support member.

18. The semiconductor laser device according to claim 13, further comprising
a lens provided on the first lid between the semiconductor laser element and the support member.

19. The semiconductor laser device according to claim 18, wherein
the semiconductor laser element is configured to emit light having a peak wavelength in a range of 300 nm to 500 nm.

20. The semiconductor laser device according to claim 19, wherein
the semiconductor laser element is formed of a Group III-V semiconductor.

21. The semiconductor laser device according to claim 1, wherein in plan view, the buffer material is continuously disposed along a periphery of the support member to surround the support member.

\* \* \* \* \*